US007144681B2

(12) United States Patent
Bolli et al.

(10) Patent No.: US 7,144,681 B2
(45) Date of Patent: *Dec. 5, 2006

(54) HEAT-SENSITIVE COMPOSITION IN WHICH REMOVAL OF THE UNEXPOSED REGIONS IS UNNECESSARY, NEGATIVE LITHOGRAPHIC PLATE COATED WITH THE SAID COMPOSITION AND METHOD FOR FORMING A NEGATIVE IMAGE ON THE SAID PLATE

(75) Inventors: Angelo Bolli, Manerbio (IT); Andrea Tettamanti, Mornico Losana (IT)

(73) Assignee: Lastra S.p.A., Manerbio (IT)

( * ) Notice: Subject to any disclaimer, the term of this patent is extended or adjusted under 35 U.S.C. 154(b) by 0 days.

This patent is subject to a terminal disclaimer.

(21) Appl. No.: 11/148,184

(22) Filed: Jun. 9, 2005

(65) Prior Publication Data

US 2005/0238995 A1 Oct. 27, 2005

Related U.S. Application Data

(62) Division of application No. 10/607,578, filed on Jun. 27, 2003.

(30) Foreign Application Priority Data

Jul. 10, 2002 (EP) ................................. 02425455

(51) Int. Cl.
*G03F 7/004* (2006.01)
*G03F 7/20* (2006.01)

(52) U.S. Cl. ...................... 430/302; 430/494; 430/944; 430/945; 430/964; 101/465; 101/466; 101/467

(58) Field of Classification Search ............ 430/270.1, 430/302, 309, 494, 944, 945, 964; 101/453, 101/463.1, 465, 466, 467
See application file for complete search history.

(56) References Cited

U.S. PATENT DOCUMENTS

| | | | | |
|---|---|---|---|---|
| 5,466,557 | A * | 11/1995 | Haley et al. | 430/278.1 |
| 5,985,514 | A * | 11/1999 | Zheng et al. | 430/270.1 |
| 6,165,679 | A * | 12/2000 | Van Damme et al. | 430/270.1 |
| 6,190,830 | B1 * | 2/2001 | Leon et al. | 430/270.1 |
| 6,602,648 | B1 * | 8/2003 | Nakamura | 430/270.1 |
| 6,610,458 | B1 * | 8/2003 | Miller et al. | 430/302 |
| 2004/0063028 | A1 * | 4/2004 | Bolli et al. | 430/270.1 |

FOREIGN PATENT DOCUMENTS

| | | | |
|---|---|---|---|
| EP | 0911153 | A1 | 4/1999 |
| EP | 0913253 | A1 | 5/1999 |
| EP | 0924065 | A1 | 6/1999 |
| EP | 1029668 | A2 | 8/2000 |
| EP | 1 129 861 | A1 * | 9/2001 |
| EP | 1170123 | A2 | 1/2002 |
| EP | 1 172 696 | A1 * | 1/2005 |
| EP | 1 129 861 | A1 * | 9/2005 |

* cited by examiner

*Primary Examiner*—Barbara L. Gilliam
(74) *Attorney, Agent, or Firm*—Jacobson Holman PLLC

(57) ABSTRACT

A heat-sensitive composition which forms an image without the removal of material, which does not require any developing treatment after the stage of exposure to heat and comprises: (a) a switchable polymer, (b) an IR absorber, (c) a triazine compound, and (d) a novolak resin.

Negative lithographic plate comprising a substrate coated with the said composition.

A method for obtaining a negative image on a substrate coated with a composition which is first hydrophobic and then lipophilic after exposure to heat, without the removal of material, the said negative image being obtained by applying a small quantity of energy to the said composition.

24 Claims, No Drawings

HEAT-SENSITIVE COMPOSITION IN WHICH REMOVAL OF THE UNEXPOSED REGIONS IS UNNECESSARY, NEGATIVE LITHOGRAPHIC PLATE COATED WITH THE SAID COMPOSITION AND METHOD FOR FORMING A NEGATIVE IMAGE ON THE SAID PLATE

This is a divisional application of application Ser. No. 10/607,578, filed Jun. 27, 2003.

FIELD OF THE INVENTION

This application is based on European Patent Application No. 02425455.9 filed on Jul. 10, 2002, the content of which is incorporated hereinto by reference.

This invention relates to a heat-sensitive composition in which removal of the unexposed regions is unnecessary, a negative lithographic plate coated with the said composition and a method for forming a negative image on the said plate.

In particular it relates to a heat-sensitive composition which during exposure to heat does not involve the ablation of exposed regions by vaporization and which after the stage of exposure to heat does not involve removal of the unexposed regions with a developer bath, thus making it possible to proceed directly from the exposure stage to the printing stage.

Even more particularly, this invention relates to a composition in which the image-forming stage requires low energy and in which the affinity of the unexposed regions for water and the affinity of the exposed regions for ink are both optimal.

BACKGROUND TO THE INVENTION

As is known, the technique of printing using lithographic plates is based on a difference in distribution between fatty substances and water. The fatty substance, or ink, is retained by the image area and water is retained by the non-image area. When the surface of a suitably prepared lithographic plate is moistened with water and then sprayed with ink, the non-image area retains the water and rejects the ink, while the image area accepts the ink and rejects the water. The ink is then transferred from the image area to the surface of a material on which it is desired to reproduce the image, such as for example paper, fabric and the like.

In general the lithographic plates used in printing processes are made from an aluminum substrate coated with a composition which is sensitive to light radiation and/or heat.

In plates of the conventional type the stage of exposure to light radiation and/or heat is followed by a stage of developing in an aqueous alkaline bath. When the portion of the exposed composition is soluble in the developer bath, the printing process is known as "positive". Conversely, when the exposed portion is insoluble, the printing process is known as "negative". In both cases the remaining image area is lipophilic and therefore accepts the ink, while the non-image area is hydrophobic and accepts the water.

EP-A-0 924 065 describes a heat-sensitive member forming an image without the ablation of material for a lithographic plate having as an upper layer on a substrate an image-forming layer comprising a binder which is switchable to heat, characterized in that the said image-forming layer becomes hydrophobic under the influence of heat, the said binder which is switchable to heat having attached hydrophobic groups and being a (co)polymer containing monomer units selected from the group comprising malic acid, itaconic acid, 3- or 4-vinylphthalic acid, cis-1,2,3,6-tetrahydrophthalic acid cis-norbene-endo-2,3-dicarboxylic acid and their hemiesters.

The heat required to form the image is provided by IR radiation and preferably the image-forming coating also contains a dye (absorber) which is capable of absorbing IR radiation and converting it at least partly into heat.

The plate in EP-A-0 924 065 has the advantage that it does not require any developing treatment after the stage of exposure to heat. In addition to this the equipment used to expose this plate to heat does not require those special systems for the collection of removed wastes which are required in the case of ablation plates, where the image is formed by removing the parts of the coating which have been exposed to heat.

This does however have the disadvantage that it requires the application of high energy in order to form the image. In fact Examples 1 and 2 in EP-A-0 924 065 indicate that in order to form an image using a laser with a power of 11 watts the drum must rotate at a speed of 40 rpm. This is equivalent to energy of approximately 710 mJoule/cm$^2$. In addition to the expenditure of energy, this means that the machine must be used at low speed, with consequent low productivity.

This makes such a plate unacceptable for the graphic arts industry.

In addition to this, experiments which have been performed by the Applicant have demonstrated that a lithographic plate coated with the composition described in Example 1 of the aforesaid patent has some affinity for ink even in the regions which have not been exposed. It follows that the images printed do not have white backgrounds (Comparison Example 1).

Another disadvantage of the aforesaid composition is that the heat-switchable binder which it contains is not stable over time. In fact in addition to incorporating a number of attached carboxyl groups, the said binder also comprises a certain percentage of maleic anhydride rings, and the latter tend to open over time, thus changing the properties of the heat-switchable binder.

The said heat-switchable binder is stable over time only when all the malic anhydride rings have been opened to form attached carboxyl groups. The Applicant has therefore tested a composition similar to that described in Example 1 in the aforesaid patent, but using a heat-switchable binder in which the malic anhydride rings have been opened by acid hydrolysis. This plate did not however form an image which had an affinity for ink.

In the graphic arts industry there is therefore still a greatly felt need for a negative lithographic plate which does not have the disadvantages of the plate in EP-A-0 924 065.

OBJECTS OF THE INVENTION

A first object of this invention is to provide a heat-sensitive composition, the composition being such that the image-forming stage requires low energy, forms an image without the removal of material and requires no developing treatment after the stage of exposure to IR radiation.

A second object is that the said composition should form an image having an optimum affinity for water in the regions which have not been exposed to heat.

A third object of this invention is a negative lithographic plate comprising a coating which in turn comprises the aforesaid composition.

A fourth object of this invention is a method for forming a negative image whose affinity for water in the unexposed regions and for ink in the exposed regions are both optimal, the said negative image being obtained in a coating on a substrate which comprises a switchable composition, forms an image without the removal of material and does not require any development treatment after the heat exposure stage, the said method comprising a stage of exposure of the said coating to heat which involves the application of a small quantity of energy.

DEFINITIONS

In this description and in the claims the following terms have the meanings indicated below.

By the term "lithographic plate" is meant a substrate covered with a sensitive coating which through exposure to light radiation and/or heat forms lipophilic image regions and hydrophobic non-image regions such that the said substrate can be used as a planographic matrix in printing processes which are based on a difference in distribution between fatty substances and water. Conventional lithographic plates also require a developing stage after exposure in order to remove the coating from the non-image regions using an aqueous alkaline developer bath. Typical examples of substrate materials are aluminum, zinc and copper, polymer substrates such as polyesters, and polymer-coated paper. Even more typically the substrate is a metal sheet, preferably aluminum. The surface of the sheet on which the coating which is sensitive to light radiation and/or heat is spread may be electrochemically grained, subjected to anodic oxidation and appropriately pretreated.

By the term "the negative type" is meant that the lipophilic image forms in the regions of the sensitive coating which have been exposed to light radiation and/or heat.

By the term "fount solution" is meant an aqueous solution comprising water (80–95%), isopropyl alcohol (5–20%) and a pH stabilising agent (2–5%). As is known to those skilled in the art, isopropyl alcohol can be replaced or accompanied by other organic substances capable of reducing or preventing mixing between ink and water such as for example ethylene glycol monobutylether, ethylene glycol mono t-butyl ether, propylene glycol monopropyl ether, propylene glycol monobutyl ether and the like.

By the term "no-process" is meant a composition which does not require a stage of developing between the stages of exposure and printing.

The term "switchable", when relating to a compound or a composition, indicates that that compound or composition is able to reverse its affinity to one of the substances used in printing (water and fatty substances) following exposure to light radiation or heat. For example a hydrophobic composition which becomes lipophilic after being exposed to light radiation and/or heat is regarded as being switchable.

The term "IR radiation" is used to indicate radiation of a wavelength between 650 nm and 1300 nm. A typical example of a device used to generate IR radiation is a laser diode which emits at approximately 830 nm.

The terms "high energy" and "large quantity of energy" indicate an energy ≧350 mJoule/$cm^2$.

The terms "low energy" and "small quantity of energy" indicate an energy ≦250 mJoule/$cm^2$.

By the term "IR absorber" is meant a compound capable of absorbing IR radiation, of converting at least part of the absorbed radiation into heat and of giving this up to the immediately adjacent environment. Typical examples of IR absorbers are carbon black and many organic dyes, especially cyanine dies.

The term "heat" indicates the heat delivered from a thermal head or from IR radiation in the presence of an IR absorber.

By the term "novolak resin" is meant a polymer obtained by the reaction between formaldehyde and phenol in a molar ratio of less than 1, for example formaldehyde:phenol=1:2, with acid catalysis. The phenol is preferably selected from the group comprising phenol, m-cresol, p-cresol, symmetrical xylenol and their mixtures.

By the term "triazine compound", is meant a compound obtained by the condensation of formaldehyde with an aminotriazine and subsequent reaction of the product so obtained with an aliphatic alcohol having 1–4 C atoms. These compounds are also known commercially as melamine resins.

SUMMARY OF THE INVENTION

The Applicant has found that all the objects of the invention are achieved by a composition comprising (a) a switchable polymer, (b) and IR absorber, (c) a triazine compound, and (d) a novolak resin.

Surprisingly this composition has an optimum affinity for water before being exposed to heat and manifests an optimum affinity for ink after being exposed to heat.

What is also surprising is that the quantity of energy required to obtain the change in affinity is small.

DETAILED DESCRIPTION OF THE INVENTION

In a first aspect this invention relates to a heat-sensitive composition which forms an image without the removal of material, requires no developing treatment after the stage of exposure to heat and comprises:

a) a switchable polymer, and b) an IR absorber, characterised in that it also comprises:

c) a triazine compound, and d) a novolak resin.

Preferably the said polymer has attached hydrophilic groups and becomes lipophilic through the effect of IR radiation.

Advantageously the said attached hydrophilic groups are carboxyl groups.

In a preferred embodiment the said switchable polymer is a (co)polymer containing monomer units selected from the group comprising malic acid, itaconic acid, 3- or 4-vinylphthalic acid, cis-1,2,3,6-tetrahydrophthalic acid, cis-norbene-endo-2,3-dicarboxylic acid and their hemiesters.

In a further preferred embodiment the said switchable polymer is obtained by the acid hydrolysis of a methyl vinyl ether copolymer and maleic anhydride, the said hydrolysis being performed in such a way as to open up the maleic anhydride rings to give each a pair of adjacent attached carboxyl groups. Advantageously, this arid hydrolysis is performed in such a way as to open all the rings in the anhydride.

Preferably the weight average weight of the switchable (co)polymer according to this invention is between 100,000 and 2,000,000.

Typical examples of switchable commercial polymers according to this invention are those obtained by the acid hydrolysis of methyl vinyl ether copolymer/maleic anhydride like the Gantrez™ products from the company ISP Chemicals which are identified by the trade names:

S 95 BF (weight average molecular weight=200,000–300,000),

S 96 BF (weight average molecular weight=700,000–800,000), and

S 97 BF (weight average molecular weight=1,500,000–1,900,000).

Preferably the quantity of the said switchable polymer in the composition according to the invention is between 50% and 75% by weight. Even more preferably the said quantity is between 55% and 70% by weight.

The type of IR absorber used in the composition according to the invention is not critical. It may for example be carbon black or one of the many organic dyes known for their ability to absorb IR radiation and convert it into heat such as, for example, cyanine.

A particularly useful family of absorbers is that characterised by the following skeleton:

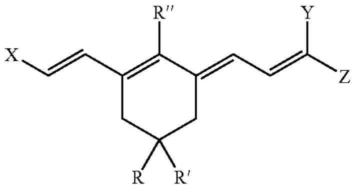

where X, Y, Z, R, R' and R" may have many meanings. Typical examples of such meanings are: a single or condensed heterocyclic ring for X, a single or condensed heterocyclic ring for Z and Y together with the carbon atom to which they are bound hydrogen, $C_{1-3}$ alkyl $SO_3^-$ or $COO^-$ for R and R' independently of each other and H or Cl for R".

Particular examples of the said heterocyclic rings are:

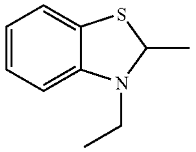

,

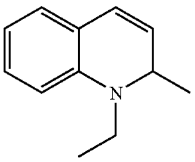

,

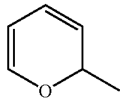

,

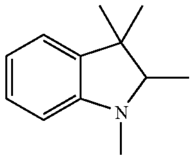

or

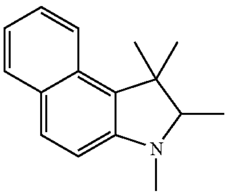

The presumed structures of some specific absorbers are:

KF 646

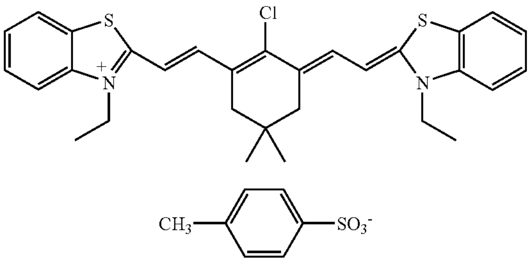

-continued

KF 645

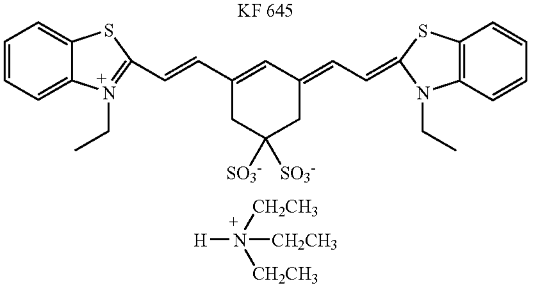

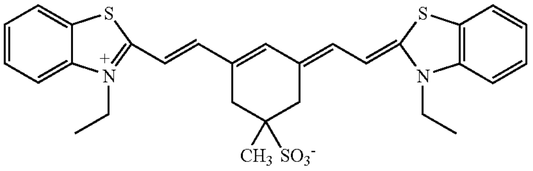

IR HBB 812

ADS830AT

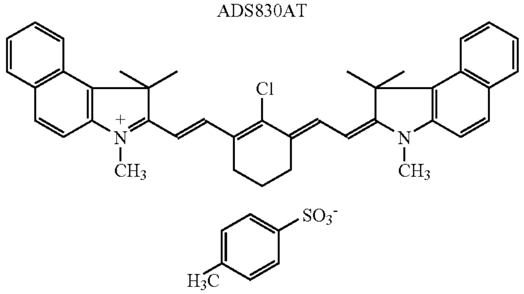

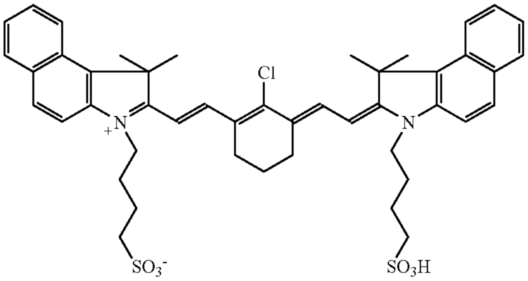

ADS830WS

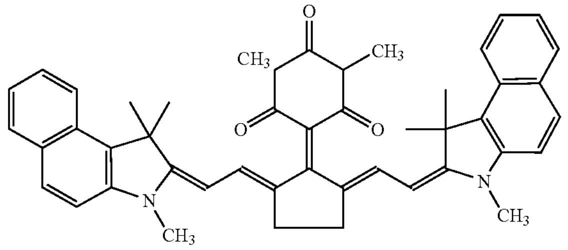

S0325

Typical examples of commercial products are the absorbers KF 646, KF 645, KF 810, KF 1003, KF 1002, IR HBB 812 and KF 818 from the Honeywell company (Seelze, Germany), the absorbers ADS830AT and ADS830WS from the American Dye Source Company (Varennes, Quebec, Canada), the absorbers PROJET 830 NP and PROJECT 825 LDI from the Avecia Company (Manchester, England) and the absorber SO325 from the FEW Chemicals GmbH company (Wolfen, Germany).

Preferably, the quantity of the said IR absorber in the composition according to this invention is from 1% to 12% by weight. Even more preferably the said quantity will be from 5% to 10% by weight.

Advantageously the triazine compound according to this invention will have the structural formula:

(A)

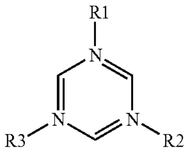

Where at least one of the substituents R1, R2 and R3 is NR'R" and the others are H or NR'R" and at least one of the substitutents R' and R" is —$CH_2$—O-$Alk_{1-4\ C}$ and the other R' and R", which are the same or different from each other, are H or —$CH_2$—O-$Alk_{1-4\ C}$.

Preferably two of these substituents R1, R2 and R3 are NR'R". Even more preferably all three substituents R1, R2 and R3 are NR'R".

As extensively described in the literature, the triazine compound of formula (A) is generally prepared by the condensation of an amino triazine of formula A in which all the substituents R' and R" are H, with a suitable quantity of formaldehyde and subsequent reaction of the methylol (—$CH_2OH$) groups formed with an $Alk_{1-4\ C}$—OH alcohol in order to yield —$CH_2$—O-$Alk_{1-4\ C}$ groups.

The preferred commercial triazine compounds according to this invention are:

Maprenal™ VMF 3935 [tri-(methoxy/n-butoxy)methyl melamine (60/40)] from the Vianova Resins company, Maprenal™ MF 927 [tri-(methoxy/n-butoxy)methyl melamine (90/10)] from the Vianova Resins company, Resimene™ CE 7103 [hexa-(methoxy/n-butoxy) methyl melamine (90/10)] from the company Solutia S.p.A., Maprenal™ VMF 3924 [tetra-(methoxy/n-butoxy)methyl melamine (50/50)] from the Vianova Resins company, Resimene™ CE 6517 [tetra-(methoxy/n-butoxy)methyl melamine (70/30)] from the company Solutia S.p.A.

Preferably the quantity of the said triazine compound in the composition according to this invention is from 10 to 30% by weight. Even more preferably this quantity is from 15 to 25% by weight.

Advantageously the novolak resin present in the composition according to this invention has a weight average molecular weight of between 2,000 and 14,000.

Preferably the composition according to this invention comprises at least two novolak resins: a first having a weight average molecular weight of between 3000 and 5000 and a second having a weight average molecular weight of between 6000 and 11000.

Typically the quantity of novolak resin in the composition according to this invention is from 1 to 20% by weight. Even more preferably the said quantity is from 5 to 20% by weight.

Typical examples of commercial novolak resins which are useful in the composition according to this invention are:

LB 6564 (weight average molecular weight 6,000–10,000) from the Bakelite company (Germany), LB 744 (weight average molecular weight 8,000–13,000) from the Bakelite company (Germany), R 7100 (weight average molecular weight 9,500–10,500) from the Rohner company (Switzerland), obtained by removing monomers from resin LB 744, PN 430 (weight average molecular weight 5,000–9,500) from the Clariant company (Germany), and PN 320 (weight average molecular weight 3,000–5,000) from the Clariant company (Germany).

An important feature of the composition according to this invention is that its hydrophilic regions (non-printing areas) are not soluble in alkali or in the wash water, but also have a high affinity for the wash water.

In a second aspect this invention relates to a negative lithographic plate comprising a substrate coated with a composition according to this invention as described above.

In a third aspect this invention relates to a method for obtaining a negative image on a substrate coated with a composition which is first hydrophilic and then lipophilic after exposure to heat, without the removal of material, the said method being characterised in that the said negative image is obtained by applying a small quantity of energy to the said compositions.

This invention is further described by the following Examples and Tests which are only of an illustrative nature and should not be regarded as limiting the invention.

Experimental Part

EXAMPLES 1–15

Compositions 7 g of each of the fifteen mixtures of components indicated in Tables 1–4 were dissolved at ambient temperature (approximately 25° C.) in 93 g of a 90:10 mixture (by weight) of N-methylpyrrolidinone: methoxypropanol, stirring mechanically until complete dissolution.

The mixture was then filtered under vacuum on Perfecte® model 2 paper (Ø=15 cm) from the Superfiltro company, Milan, Italy.

TABLE 1

| Component | Composition no. 1 % (w/w) | 2 % (w/w) | 3 % (w/w) | 4 % (w/w) |
|---|---|---|---|---|
| Gantrez ™ S 97 BF | 54.32 | | | 59.26 |
| Gantrez ™ S 95 BF | | 54.32 | | |
| Gantrez ™ S 96 BF | | | 54.32 | |
| Maprenal ™ VMF 3935 [70% solution (w/w) in butyl alcohol] | 19.75 | 19.75 | 19.75 | 19.75 |
| R 7100 | 18.52 | 18.52 | 18.52 | 13.58 |
| ADS 830AT | 7.408 | 7.408 | 7.408 | 7.408 |

TABLE 2

| Component | Composition no. 5 % (w/w) | 6 % (w/w) | 7 % (w/w) | 8 % (w/w) |
|---|---|---|---|---|
| Gantrez ™ S 97 BF | 57.28 | 66.17 | 57.28 | 57.28 |
| Maprenal ™ VMF 3935/70 B | 23.7 | 18.76 | 23.7 | 23.7 |
| R 7100 | 11.61 | 7.66 | 11.61 | 11.61 |
| ADS 830AT | 7.408 | 7.408 | 5.408 | |
| S0325 | | | 2 | 7.408 |

TABLE 3

| | Composition no. | | | |
|---|---|---|---|---|
| Component | 9 % (w/w) | 10 % (w/w) | 11 % (w/w) | 12 % (w/w) |
| Gantrez ™ S 97 BF | 64.2 | 64.2 | 64.2 | 58.27 |
| Maprenal ™ VMF 3935/70 B | 19.75 | | | 21.73 |
| Maprenal ™ MF 904 | | 19.75 | | |
| Maprenal ™ MF 927 | | | 19.75 | |
| R 7100 | 8.64 | 8.64 | 8.64 | 12.59 |
| ADS 830AT | 7.408 | 7.408 | 7.408 | 7.408 |

TABLE 4

| | Composition no. | | |
|---|---|---|---|
| Component | 13 % (w/w) | 14 % (w/w) | 15 % (w/w) |
| Gantrez ™ S 97 BF | 69.17 | 69.17 | 69.17 |
| Maprenal ™ VMF 3935/70 B | 17.26 | 17.26 | 17.26 |
| R 7100 | 6.16 | | |
| LB 6564 | | 6.16 | |
| PN 430 | | | 6.16 |
| ADS 830AT | 7.408 | 7.408 | 7.408 |

EXAMPLES 16–46

Lithographic Plates

The composition in Examples 1–1 5 above were spread on to

A) degreased aluminium, and

B) aluminium electrochemically grained, subjected to anodic oxidation and treated with a solution of polyvinyl phosphonic acid.

The plates coated in this way were dried in a hot-air furnace (PID System M80-VF from the company MPM Instruments s.r.l., Bernareggio, Milan, Italy) at 85° C. for 8 minutes. The weight of the photosensitive coating lay between 2.5 and 4.0 g/m$^2$.

The plates so obtained are listed in Table 5 below.

TABLE 5

| Composition | Substrate | Plate Code |
|---|---|---|
| 1 | A | A1 |
| 1 | B | B1 |
| 2 | A | A2 |
| 2 | B | B2 |
| 3 | A | A3 |
| 3 | B | B3 |
| 4 | A | A4 |
| 4 | B | B4 |
| 5 | A | A5 |
| 5 | B | B5 |
| 6 | A | A6 |
| 6 | B | B6 |
| 7 | A | A7 |
| 7 | B | B7 |
| 8 | A | A8 |
| 8 | B | B8 |
| 9 | A | A9 |
| 9 | B | B9 |
| 10 | A | A10 |
| 10 | B | B10 |
| 11 | A | A11 |
| 11 | B | B11 |

TABLE 5-continued

| Composition | Substrate | Plate Code |
|---|---|---|
| 12 | A | A12 |
| 12 | B | B12 |
| 13 | A | A13 |
| 13 | B | B13 |
| 14 | A | A14 |
| 14 | B | B14 |
| 15 | A | A15 |
| 15 | B | B15 |

After being allowed to stand for at least 24 hours, the plates were subjected to the following Tests.

Tests

Properties

The lithographic plates in Table 5 were exposed to IR radiation having a wavelength of 830 nm (Platesetter LOTEM™ 800 V from the Scitex Co., Herzlia, Israel) at 2540 dpi. Exposure was carried out by projecting a UGRA/FOGRA PostScript Control Strip digital scale at an intensity varying from 180 mW to 300 mW and at a constant drum speed (700 rpm), corresponding to energy levels substantially between 150 mJ/cm$^2$ and 250 mJ/cm$^2$.

After exposure the plates showed an advantageous change of colour in the exposed regions in comparison with the unexposed regions thus making it possible even at that stage to assess the quality of the negative image obtained.

The plates were then subjected to printing tests using a Speedmaster™ printing machine from the Heidelberg Company equipped with wash water containing 2% of isopropyl alcohol and 2% of the wash additive JOLLY FOUNT™ LAB 55 from Lastra S.p.a. and ink of the HARD CLIPPER BLACK OFFSET™ type from the Mander-Kidd company, England. The printing speed was 5000 sheets/hour and the paper was of the Patinato type weighing 80 g/m$^2$.

Sensitivity was measured for each plate by determining the exposure conditions required to obtain a print which faithfully reproduced the UGRA/FOGRA PostScript Control Strip digital scale.

The results of these measurements are shown in Table 6 below.

The following parameters were determined at the same time:

- number of sheets required to achieve cleaning of the background,
- number of sheets required in order to reach the correct ink density in the printing zone, and
- maximum number of copies which could be printed (strength of the printing regions).

In a certain number of cases the number of sheets required to achieve cleaning of the background and to achieve the correct ink density in the printing zone were only a few units (5–10).

The number of copies printed was 40,000 copies or more for a certain number of plates.

TABLE 6

| Plate | Sensitivity |
|---|---|
| A1 | 300 mW; 700 rpm |
| B1 | 300 mW; 700 rpm |
| A2 | 300 mW; 700 rpm |

TABLE 6-continued

| Plate | Sensitivity |
|---|---|
| B2 | 300 mW; 700 rpm |
| A3 | 300 mW; 700 rpm |
| B3 | 300 mW; 700 rpm |
| A4 | 260 mW; 700 rpm |
| B4 | 240 mW; 700 rpm |
| A5 | 280 mW; 700 rpm |
| B5 | 260 mW; 700 rpm |
| A6 | 260 mW; 700 rpm |
| B6 | 240 mW; 700 rpm |
| A7 | 280 mW; 700 rpm |
| B7 | 260 mW; 700 rpm |
| A8 | 280 mW; 700 rpm |
| B8 | 260 mW; 700 rpm |
| A9 | 260 mW; 700 rpm |
| B9 | 240 mW; 700 rpm |
| A10 | 280 mW; 700 rpm |
| B10 | 260 mW; 700 rpm |
| A11 | 260 mW; 700 rpm |
| B11 | 240 mW; 700 rpm |
| A12 | 260 mW; 700 rpm |
| B12 | 240 mW; 700 rpm |
| A13 | 280 mW; 700 rpm |
| B13 | 260 mW; 700 rpm |
| A14 | 300 mW; 700 rpm |
| B14 | 300 mW; 700 rpm |
| A15 | 300 mW; 700 rpm |
| B15 | 300 mW; 700 rpm |

COMPARISON EXAMPLE 1

The composition in Example 1 in EP-A-0 924 065 was prepared.

7.73 9 of the said composition were dissolved in 90 g of a mixture comprising tetrahydrofuran 44% (w/w), 1-methoxy-2-propanol 34% (w/w) and 2-butanone 22% (w/w).

The mixture so obtained was used to coat aluminium plates which had been electrochemically grained, subjected to anodic oxidation and treated with a solution of polyvinyl sulphonic acid. The plates coated in this way were then dried in a furnace as described for Examples 16–46.

In three successive preparations the quantity of dry coating applied to the plate was 0.9 $g/m^2$, 1.59 $g/m^2$ and 2.57 $g/m^2$.

The plates obtained in this way were exposed to heat as indicated in Example 1 of EP-A-0 924 065 and were then subjected to printing tests as described in the "Tests" above.

In no case was it possible to obtain acceptable cleaning of the background until approximately 1000 pages had been printed.

The invention claimed is:

1. A method for making a lithographic printing plate precursor by exposing it to heat whereby an image is formed without the removal of material and without any development treatment, and wherein said precursor comprises a) a switchable polymer, and b) an IR absorber, characterized in that it also comprises c) a triazine compound and d) a novolak resin.

2. The method according to claim 1, wherein the switchable polymer has attached hydrophilic groups and becomes lipophilic through the effect of IR radiation.

3. The method according to claim 2, wherein said attached hydrophilic groups are carboxyl groups.

4. The method according to claim 1, wherein the lithographic printing plate precursor is exposed with an energy equal to or lower than 250 $mJoule/cm^2$.

5. The method according to claim 1, wherein the switchable polymer is obtained by the acid hydrolysis of a copolymer of methyl vinyl ether and maleic anhydride.

6. The method according to claim 1, wherein the quantity of said switchable polymer is from 50% to 75% by weight.

7. The method according to claim 1, wherein the quantity of said switchable polymer is from 55% to 70% by weight.

8. The method according to claim 1, wherein the IR absorber is a cyanine dye.

9. The method according to claim 1, wherein the IR absorber has the following formula

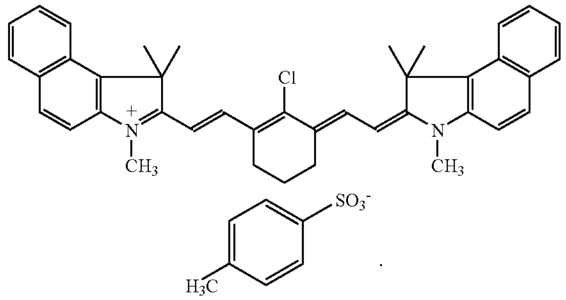

10. The method according to claim 1, wherein the quantity of said IR absorber is from 1% to 12% by weight.

11. The method according to claim 1, wherein the quantity of said IR absorber is from 5% to 10% by weight.

12. The method according to claim 1, wherein the triazine compound has the structural formula:

(A)

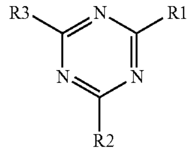

where at least one of the substituents R1, R2 and R3 is NR'R" and the others are H or NR'R" and at least one of the substituents R' and R" is $-CH_2-O-Alk_{1\text{-}4\ C}$ and the others R' and R", which are the same or different from each other, are H or $-CH_2-O\text{-}Alk_{1\text{-}4\ C}$.

13. The method according to claim 12, wherein two of the substituents R1, R2 and R3 are NR'R".

14. The method according to claim 13, wherein the two R' substituents are $-CH_2-O-CH_3$ and the two R" substituents are $-CH_2-O-C_4H_9$.

15. The method according to claim 12, wherein all three substituents R1, R2 and R3 are NR'R".

16. The method according to claim 15, wherein the three R' substituents are H, two of the R" substituents are $-CH_2-O-CH_3$ and the third R" substituent is $-CH_2-O-C_4H_9$.

17. The method according to claim 15, wherein the three R' substituents are $-CH_2-O-CH_3$ and the three R" substituents are $-CH_2-O-CH_3$.

18. The method according to claim 15, wherein the three R' substituents are $-CH_2-O-CH_3$ and the three R" substituents are $-CH_2-O-C_4H_9$.

19. The method according to claim 1, wherein the quantity of said triazine compound is from 10 to 30% by weight.

20. The method according to claim 1, wherein the quantity of said triazine compound is from 15 to 25% by weight.

21. The method according to claim 1, wherein said novolak resin has a weight average molecular weight of between 2,000 and 14,000.

22. The method according to claim 1, wherein said precursor comprises at least two novolak resins, a first having a weight average molecular weight of between 3,000 and 5,000 and a second having a weight average molecular weight of between 6,000 and 11,000.

23. The method according to claim 1, wherein the total quantity of novolak resin is from 1 to 20% by weight.

24. The method according to claim 1, wherein the total quantity of novolak resin is from 5 to 20% by weight.

* * * * *